US007253587B2

(12) United States Patent
Meissner

(10) Patent No.: US 7,253,587 B2
(45) Date of Patent: Aug. 7, 2007

(54) METHOD FOR PREDICTION OF ELECTRICAL CHARACTERISTICS OF AN ELECTROCHEMICAL STORAGE BATTERY

(75) Inventor: Eberhard Meissner, Wunstorf (DE)

(73) Assignee: VB Autobatterie GmbH, Hannover (DE)

( * ) Notice: Subject to any disclaimer, the term of this patent is extended or adjusted under 35 U.S.C. 154(b) by 306 days.

(21) Appl. No.: 10/912,748

(22) Filed: Aug. 5, 2004

(65) Prior Publication Data

US 2005/0052158 A1 Mar. 10, 2005

(30) Foreign Application Priority Data

Aug. 6, 2003 (DE) ................ 103 35 930

(51) Int. Cl.
*H01M 10/44* (2006.01)
(52) U.S. Cl. ...................................... 320/132
(58) Field of Classification Search ................ 320/132, 320/149; 324/426, 427, 430, 431, 433
See application file for complete search history.

(56) References Cited

U.S. PATENT DOCUMENTS

| | | |
|---|---|---|
| 3,906,329 A | 9/1975 | Bader |
| 4,153,867 A | 5/1979 | Jungfer |
| 4,193,025 A | 3/1980 | Frailing et al. |
| 4,207,611 A | 6/1980 | Gordon |
| 4,322,685 A | 3/1982 | Frailing et al. |
| 4,595,880 A | 6/1986 | Patil |
| 4,642,600 A | 2/1987 | Gummelt et al. |
| 4,659,977 A | 4/1987 | Kissel et al. |
| 4,665,370 A | 5/1987 | Holland |
| 4,719,427 A | 1/1988 | Morishita et al. |
| 4,816,736 A | 3/1989 | Dougherty et al. |
| 4,876,513 A | 10/1989 | Brilmyer et al. |
| 4,888,716 A | 12/1989 | Ueno |
| 4,937,528 A | 6/1990 | Palanisamy |
| 4,943,777 A | 7/1990 | Nakamura et al. |
| 4,952,861 A | 8/1990 | Horn |
| 5,002,840 A | 3/1991 | Klebenow et al. |
| 5,032,825 A | 7/1991 | Kuznicki |
| 5,055,656 A | 10/1991 | Farah et al. |
| 5,079,716 A | 1/1992 | Lenhardt et al. |
| 5,130,699 A | 7/1992 | Reher et al. |
| 5,159,272 A | 10/1992 | Rao et al. |
| 5,162,164 A | 11/1992 | Dougherty et al. |
| 5,204,610 A | 4/1993 | Pierson et al. |
| 5,223,351 A | 6/1993 | Wruck |
| 5,280,231 A | 1/1994 | Kato et al. |
| 5,281,919 A | 1/1994 | Palanisamy |
| 5,316,868 A | 5/1994 | Dougherty et al. |
| 5,321,627 A | 6/1994 | Reher |
| 5,352,968 A | 10/1994 | Reni et al. |
| 5,381,096 A | 1/1995 | Hirzel |
| 5,404,129 A | 4/1995 | Novak et al. |
| 5,412,323 A | 5/1995 | Kato et al. |
| 5,416,402 A | 5/1995 | Reher et al. |
| 5,428,560 A | 6/1995 | Leon et al. |
| 5,439,577 A | 8/1995 | Weres et al. |
| 5,488,283 A | 1/1996 | Dougherty et al. |
| 5,549,984 A | 8/1996 | Dougherty |
| 5,552,642 A | 9/1996 | Dougherty et al. |
| 5,563,496 A | 10/1996 | McClure |
| 5,572,136 A | 11/1996 | Champlin |
| 5,578,915 A | 11/1996 | Crouch, Jr. et al. |
| 5,650,712 A | 7/1997 | Kawai et al. |
| 5,656,915 A | 8/1997 | Eaves |
| 5,680,050 A | 10/1997 | Kawai et al. |
| 5,698,965 A | 12/1997 | York |
| 5,721,688 A | 2/1998 | Bramwell |
| 5,744,936 A | 4/1998 | Kawakami |
| 5,744,963 A | 4/1998 | Arai et al. |
| 5,761,072 A | 6/1998 | Bardsley, Jr. et al. |
| 5,773,977 A | 6/1998 | Dougherty |
| 5,808,367 A | 9/1998 | Akagi et al. |
| 5,808,445 A | 9/1998 | Aylor et al. |
| 5,818,116 A | 10/1998 | Nakae et al. |
| 5,818,333 A | 10/1998 | Yaffe et al. |
| 5,896,023 A | 4/1999 | Richter |
| 5,898,292 A | 4/1999 | Takemoto et al. |
| 5,936,383 A | 8/1999 | Ng et al. |
| 5,965,954 A | 10/1999 | Johnson et al. |
| 5,977,654 A | 11/1999 | Johnson et al. |
| 5,990,660 A | 11/1999 | Meissner |

(Continued)

FOREIGN PATENT DOCUMENTS

DE 22 42 410 3/1973

(Continued)

OTHER PUBLICATIONS

Intelec ' 88—Tenth International communications Energy Conference, "A look at the Impedance of a Cell—S.L. DeBardelaben, New York Telephone Company," bearing a designation "Oct. 30-Nov. 2, 1988." (6 sheets).

(Continued)

*Primary Examiner*—Edward H. Tso
(74) *Attorney, Agent, or Firm*—Foley & Lardner LLP

(57) ABSTRACT

A method for prediction of electrical characteristics of an electrochemical storage battery and includes determining a functional relationship between a state of charge value which is related to a first parameter for a storage battery and a second state of charge value which is related to a second parameter for the storage battery for a second phase of use of the storage battery. The method also includes determining at least one characteristic variable from the reference of the functional relationship for the second phase to a state characteristic variable profile for a previous first phase of use of the storage battery. The method further includes predicting electrical characteristics of the storage battery utilizing a functional relationship between the characteristic variable and the electrical characteristics.

28 Claims, 5 Drawing Sheets

U.S. PATENT DOCUMENTS

| | | | |
|---|---|---|---|
| 6,016,047 | A | 1/2000 | Notten et al. |
| 6,037,749 | A | 3/2000 | Parsonage |
| 6,037,777 | A | 3/2000 | Champlin |
| 6,057,666 | A | 5/2000 | Dougherty et al. |
| 6,087,808 | A | 7/2000 | Pritchard |
| 6,091,325 | A | 7/2000 | Zur et al. |
| 6,118,252 | A | 9/2000 | Richter |
| 6,118,275 | A | 9/2000 | Yoon et al. |
| 6,144,185 | A | 11/2000 | Dougherty et al. |
| 6,160,382 | A | 12/2000 | Yoon et al. |
| 6,222,341 | B1 | 4/2001 | Dougherty et al. |
| 6,268,712 | B1 | 7/2001 | Laig-Horstebrock et al. |
| 6,271,642 | B1 | 8/2001 | Dougherty et al. |
| 6,296,593 | B1 | 10/2001 | Gotou et al. |
| 6,300,763 | B1 | 10/2001 | Kwok |
| 6,304,059 | B1 | 10/2001 | Chalasani et al. |
| 6,331,762 | B1 | 12/2001 | Bertness |
| 6,369,578 | B1 | 4/2002 | Crouch, Jr. et al. |
| 6,388,421 | B2 | 5/2002 | Abe |
| 6,388,450 | B2 | 5/2002 | Richter et al. |
| 6,392,389 | B1 | 5/2002 | Kohler |
| 6,392,414 | B2 | 5/2002 | Bertness |
| 6,392,415 | B2 | 5/2002 | Laig-Horstebrock et al. |
| 6,417,668 | B1 | 7/2002 | Howard et al. |
| 6,424,157 | B1 | 7/2002 | Gollomp et al. |
| 6,441,585 | B1 | 8/2002 | Bertness |
| 6,445,158 | B1 | 9/2002 | Bertness et al. |
| 6,452,361 | B2 | 9/2002 | Dougherty et al. |
| 6,472,875 | B1 | 10/2002 | Meyer |
| 6,495,990 | B2 | 12/2002 | Champlin |
| 6,507,194 | B2 | 1/2003 | Suzuki |
| 6,515,452 | B2 | 2/2003 | Choo |
| 6,515,456 | B1 | 2/2003 | Mixon |
| 6,522,148 | B2 | 2/2003 | Ochiai et al. |
| 6,534,992 | B2 | 3/2003 | Meissner et al. |
| 6,556,019 | B2 | 4/2003 | Bertness |
| 6,600,237 | B1 | 7/2003 | Meissner |
| 6,600,293 | B2 | 7/2003 | Kikuchi |
| 6,608,482 | B2 | 8/2003 | Sakai et al. |
| 6,653,818 | B2 | 11/2003 | Laig-Horstebrock et al. |
| 2002/0008495 | A1 | 1/2002 | Dougherty et al. |
| 2002/0026252 | A1 | 2/2002 | Wruck et al. |
| 2002/0031700 | A1 | 3/2002 | Wruck et al. |
| 2003/0047366 | A1 | 3/2003 | Andrew et al. |
| 2003/0082440 | A1 | 5/2003 | Mrotek et al. |
| 2003/0142228 | A1 | 7/2003 | Flach et al. |
| 2003/0236656 | A1 | 12/2003 | Dougherty |
| 2004/0021468 | A1 | 2/2004 | Dougherty et al. |

FOREIGN PATENT DOCUMENTS

| | | |
|---|---|---|
| DE | 22 42 510 | 4/1974 |
| DE | 25 11 426 A1 | 9/1975 |
| DE | 33 34 128 A1 | 4/1985 |
| DE | 37 12 629 C2 | 10/1987 |
| DE | 38 08 559 A1 | 9/1989 |
| DE | 40 07 883 A1 | 9/1991 |
| DE | 38 82 374 T2 | 10/1993 |
| DE | 44 14 134 A1 | 11/1994 |
| DE | 43 39 568 A1 | 5/1995 |
| DE | 39 01 680 C3 | 6/1995 |
| DE | 689 24 169 T2 | 3/1996 |
| DE | 195 40 827 A1 | 5/1996 |
| DE | 195 43 874 A1 | 5/1996 |
| DE | 197 50 309 A1 | 5/1999 |
| DE | 691 31 276 T2 | 12/1999 |
| DE | 198 47 648 A1 | 4/2000 |
| DE | 694 23 918 T2 | 8/2000 |
| DE | 199 52 693 A1 | 5/2001 |
| DE | 199 60 761 C1 | 5/2001 |
| DE | 199 59 019 A1 | 6/2001 |
| DE | 93 21 638 U1 | 8/2001 |
| DE | 100 08 354 A1 | 8/2001 |
| DE | 100 21 161 A1 | 10/2001 |
| DE | 699 00 638 T2 | 8/2002 |
| DE | 101 28 033 A1 | 12/2002 |
| DE | 101 56 891 A1 | 5/2003 |
| EP | 0 516 336 B1 | 2/1992 |
| EP | 1 116 958 A2 | 7/2001 |
| EP | 1 120 641 A2 | 8/2001 |
| EP | 1 120 663 A2 | 8/2001 |
| WO | WO 97/15839 | 5/1997 |
| WO | WO 99 17128 | 4/1999 |
| WO | WO 99 66340 | 12/1999 |
| WO | WO 00/04620 | 1/2000 |
| WO | WO 01 15023 | 3/2001 |
| WO | WO 03/001224 A1 | 1/2003 |

OTHER PUBLICATIONS

Battery Alert, Ltd., "The Easy-to-Install Battery Deterioration Warning Device", 12 Volt Model (BA101) Advertisement (2 sheets).

Journal of Applied Electrochemistry, vol. 10 No. 1, Jan. 1980—The Impedance of Electrical Storage Cells—N.A. Hampson, s.A.G.R. Karunathilaka, Department of Chemistry, R. Leek, Department of Electronic and Electrical Engineering, University of Technology, Loughborough, Liecestershire, UK (11 sheets).

Battery Evaluation Reports, s.e. Ross Laboratories, Inc., Apr. 1999 (1 page).

HSR-003 Application Notes, Hermetic Switch, Inc., Highway 92, Post Office Box 2220, Chickasha, OK 73023, http://www.hermeticswitch.com/RS_frm.htm, available at least by Jan. 6, 2003 (1 page).

How It Works: Reed Switch Motor, http://members.tripod.com/simplemotor/rsmotor.htm, available at least by Jan. 7, 2003, 4 pages.

Reed Relay Technical & Application Information, COTO Technology, 55 Dupont Drive, Providence, RI, pgs. http://www.cotorelay.com/ReedTech.pdf, available at least by Jan. 6, 2003, 37-43.

Willibert Schleuter, *Das elektrische Ersatzschaltbild des Bleiakkumulators unter Berücksichtigung erzwungener Elektrolytströmung*, etz Archiv, vol. 4 (1982), Issue 7, pp. 213-218.

Lürkens et al., *Ladezustandsschätzuntt von Bleibatterien mit Hilfe des Kalman-Filters*, etz Archiv, vol. 8 (1986), Issue 7, pp. 231-236.

Brooke, L., "Resin Keeps Batteries Cool", A1 Inside Magazine, Nov. 1998, p. 55.

Hoover, J., "Failure Modes of Batteries Removed from Service", A Presentation at the 107th Convention of Battery Council International, Apr. 30-May 3, 1995, p. 62.

Stan Gibilisco and Neil Sclater, Co-Editors-in-Chief, "Rectifier Bridge," Encyclopedia of Electronics, 2nd Edition, TAB Professional and Reference Books, 1996, pp. 708-711.

Lehman, A., "Electrical Battery Model for Leo Application Based on Absolute Instantaneous State of Charge," Proceedings of the European Space Power Conference held in Madrid, Spain, Oct. 2-6, 1989, ESA Publications, NL, vol. 1, pp. 173-178.

Robbins, Tim & Hawkins, John, "Battery Model for Over-Current Protection Simulation of DC Distribution Systems," Telecommunications Energy Conference, 1994, Intelec '94, 16th International Vancouver, BC, Canada Oct. 30-Nov. 3, 1994, New York, NY, IEEE, pp. 307-314 XP001036407 ISBN: 0-7803-2034-4.

Mayer, D. et al., "Modelling and Analysis of Lead Acid Battery Operation," Ecole des Mines de Paris, XP010092137, pp. 1-3.

Mauracher, P. & Karden, E., "Dynamic Modelling of Lead/Acid Batteries Using Impedance Spectroscopy for Parameter Identification," Journal of Power Sources, Elsevier Sequoia S.A., Lausanne, Ch., vol. 67 (1997) No. 1-2, pp. 69-84, XP004095174 ISSN: 0378-7753, p. 70, line 11; p. 82, line 5, figures 2, 3, 12.

Baert, D & Vervaet, A., "Lead-Acid Battery Model for the Derivation of Peukert's Law," Electrochimica Acta, Elsevier Science Publishers, Barking, GB, vol. 44, No. 20, pp. 3491-3504 XP004168624 ISSN: 0013-4686.

International Search Report for PCT/US02/19760 (international filing date Jun. 21, 2002), date of mailing Oct. 10, 2002.

Conference Proceedings, Intelec '86—International Telecommunications Energy Conference, Determining the End of Battery Life—Sheldon DeBardelaben, New York Telephone Company, bearing a designation "Oct. 19-22, 1986." (6 sheets).

Bosch and the New E-Class, Electronic Battery Management System, Focus on Electronics, Nov. 2002 (1 sheet).

Forecast Review, The Battery Man, Nov. 1996 p. 21.

OnGuard™ XT Battery State-of Health Monitor, 2003 Midtronics, Inc. P/N 156-983A (2 sheets).

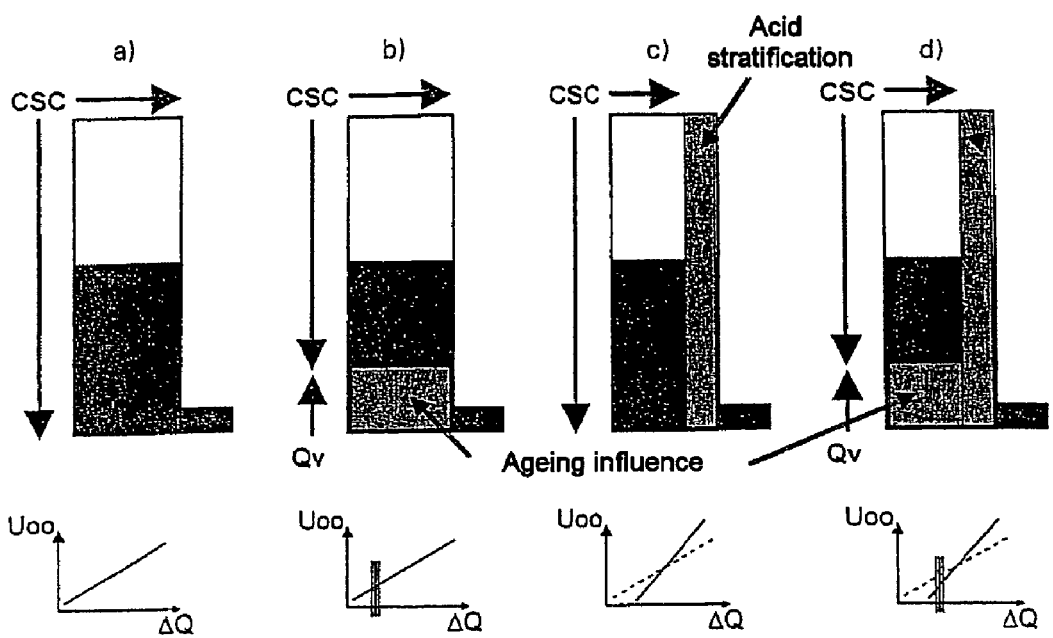
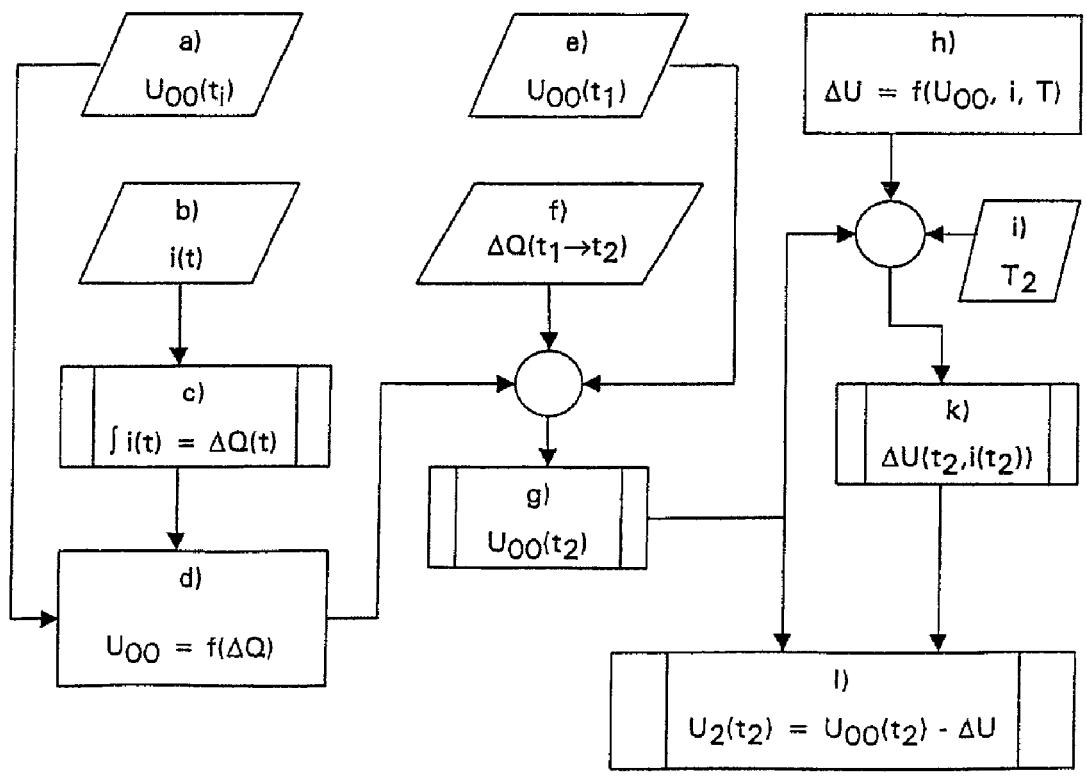
Fig. 3
Fig. 4

METHOD FOR PREDICTION OF ELECTRICAL CHARACTERISTICS OF AN ELECTROCHEMICAL STORAGE BATTERY

CROSS-REFERENCE TO RELATED PATENT APPLICATIONS

This application claims the benefit under 35 U.S.C. § 119 of German Patent Application DE 103 35 930.3-45, which was filed on Aug. 6, 2003, and which is incorporated herein by reference in its entirety, including the specification, drawings, claims and abstract.

BACKGROUND

The present invention relates to a method for prediction of electrical characteristics of an electrochemical storage battery.

It may be desirable to determine or to predict at any given time the state of an electrical storage battery, such as the state of charge or the heavy-current load capability. By way of example, the capability of a starter battery to start a motor vehicle with an internal combustion engine is governed by the state of charge and the state of aging and by the characteristic drop in capacity of the battery, since the current level which can be drawn from the starter battery and the power which can be emitted are limited. It is particularly important to determine the state of charge and the starting capability of a starter battery in situations in which, for example, the engine is operated intermittently hence, in this case, the vehicle power supply system together with its loads is still operated during times in which the engine is switched off, even though the generator is not producing any electrical power. In situations such as this, the monitoring of the state of charge and of the starting capability of a storage battery must ensure that the energy content of the storage battery always remains sufficient to still start the engine.

Widely differing methods are known for measurement of the state of charge and for determination of the load behavior of storage batteries. For example, integrated test equipment (amp-hour (Ah) meters) is used for this purpose, with the charging current being taken into account, and possibly with an assessment using a fixed charging factor. Since the usable capacity of a storage battery is highly dependent on the magnitude of the discharge current and the temperature, even a method such as this does not allow a satisfactory statement to be produced about the usable capacity which can still be drawn from the battery.

By way of example, in the case of a method for measurement of the state of charge, DE 22 42 510 C1 discloses the assessment of charging current by means of a factor which is itself dependent on the temperature and on the state of charge of the battery.

DE 40 07 883 A1 describes a method in which the starting capability of a storage battery is determined by measurement of the battery terminal voltage and of the battery temperature, and by comparison with a state of charge family of characteristics which is applicable to the battery type to be tested.

DE 195 43 874 A1 discloses a calculation method for the discharge characteristic and remaining capacity measurement of a storage battery, in which the current, voltage, and temperature are likewise measured, and with the discharge characteristic being approximated by means of a mathematical function with a curved surface.

DE 39 01 680 C1 describes a method for monitoring the cold starting capability of a starter battery, in which the starter battery is loaded with a resistance at times. The voltage which is dropped across the resistance is measured, and is compared with empirical values in order to determine whether the cold starting capability of the starter battery is still sufficient. The starting process is in this case used to load the starter battery.

Furthermore, DE 43 39 568 A1 discloses a method for determination of the state of charge of a motor vehicle starter battery, in which the battery current and the rest voltage are measured, and are used to deduce the state of charge. The battery temperature is also taken into account in this case. The charging currents which are measured during different time periods are compared with one another, and are used to determine a remaining capacity.

DE 198 47 648 A1 describes a method for learning a relationship between the rest voltage and the state of charge of a storage battery in order to estimate the storage capability. A measure for the acid capacity of the electrolyte in the storage battery is determined from the relationship of the rest voltage difference to the amount of current transferred during the load phase. This makes use of the fact that the rest voltage for the higher state of charge ranges which are relevant for practical use rises approximately linearly with the state of charge.

One problem of determining the state of an electrochemical storage battery using known methods is that wear occurs in particular while rechargeable storage batteries are being discharged and charged, as well as while they are being stored without any load, and the conventional methods do not take account of all the relevant wear factors.

In the case of lead-acid rechargeable batteries, the wear relates on the one hand to corrosion phenomena, which reduce the voltage level when heavy electrical loads are applied, and on the other hand to changes in the morphology and the chemical composition of the active substances. Furthermore, parasitic reactions such as electrolysis and corrosion of gratings, or else simple vaporization, lead to a loss of water from the electrolyte. In the case of a rechargeable battery with liquid electrolytes, this is evident in a reduction on the electrolyte level. Parts which were previously covered with electrolytes in consequence become exposed, and this can lead to a change in the corrosion behavior in these areas. Furthermore, acid stratification can occur by the acid falling in layers on the base of the storage battery, which leads to an increase in the acid capacity in the lower area and to a reduction in the acid capacity in the upper area. In the case of rechargeable batteries with solid electrolytes (e.g., so-called sealed rechargeable batteries), in which the electrolyte is immobilized, for example, by means of a glass fiber mat or a gel, the saturation level of the electrode set (which comprises the porous electrodes and microporous separators and/or a gel) falls with the electrolyte. This is evident, inter alia, in an increased internal resistance and, in some cases, in a reduced capacity. Furthermore, as the electrode set dries out to an increasing extent, the rate of the parasitic oxygen circulation rises, which, in the case of rechargeable batteries of this type, on the one hand reduces the water loss by electrolysis, but on the other hand can reduce the charging efficiency and can increase the heating of the rechargeable battery during charging.

In both situations, the rest voltage of the rechargeable battery for a given degree of discharge (DoD) rises, because the loss of water (WL) with the amount of sulfuric acid unchanged leads to an increased concentration of the dilute sulfuric acid electrolyte, and the rest voltage ($U_{00}$) rises strictly monotonically with the acid concentration, by virtue of the electrochemical relationships.

Accordingly, it would be advantageous to provide an improved method for prediction of electrical characteristics of an electrochemical storage battery.

SUMMARY

An exemplary embodiment relates to a method for prediction of electrical characteristics of an electrochemical storage battery and includes determining a functional relationship between a state of charge value which is related to a first parameter for a storage battery and a second state of charge value which is related to a second parameter for the storage battery for a second phase of use of the storage battery. The method also includes determining at least one characteristic variable from the reference of the functional relationship for the second phase to a state characteristic variable profile for a previous first phase of use of the storage battery. The method further includes predicting electrical characteristics of the storage battery utilizing a functional relationship between the characteristic variable and the electrical characteristics

BRIEF DESCRIPTION OF THE DRAWINGS

FIG. 3 shows an illustration of the influence of aging and of acid stratification on the profile of the functional relationship between the rest voltage and the amount of charge transferred.

FIG. 4 is a flowchart for prediction of a voltage which is produced by a storage battery when on load, for heavy-current prediction.

DETAILED DESCRIPTION OF THE EXEMPLARY EMBODIMENTS

Figure 1:
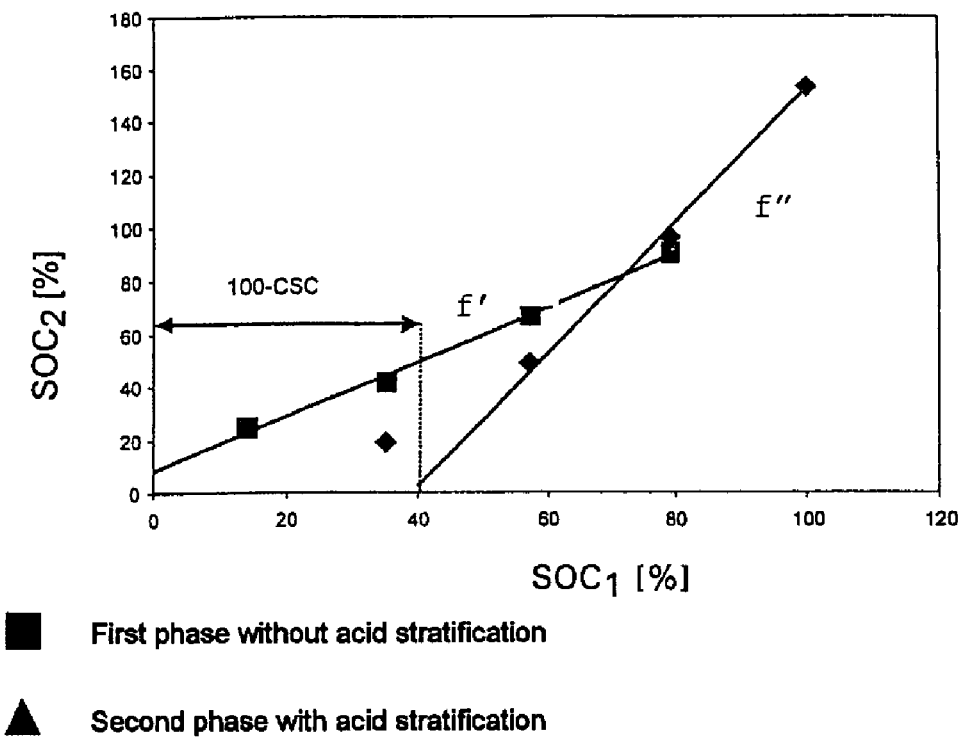
FIG. 1 shows a functional relationship between a state of charge value which relates to a first parameter and a state of charge value which relates to a second parameter for a first phase and a second phase of use of a storage battery.

According to an exemplary embodiment, a method for prediction of electrical characteristics of an electrochemical storage battery (e.g., a lead-acid battery) includes determination of the functional relationship between a first state of charge value which is related to a first parameter for the storage battery and a second state of charge value which is related to a second parameter for the storage battery for a second phase of use of the storage battery; determination of at least one characteristic variable G from the reference of the functional relationship for the second phase to a state characteristic variable profile for a previous first phase of use of the storage battery; and prediction of the electrical characteristics of the storage battery with the aid of a functional relationship for the characteristic variable G with the electrical characteristics.

It has been found that the relevant wear parameters for state determination are virtually completely taken into account if the state of charge is determined using two different methods with respect to a first parameter and a second parameter. Specifically, it has been found that, for example, the value of the acid density has a different effect on the state of charge value which is related to the transferred amount of charge as the first parameter than on the state of charge value which is related to the rest voltage as the second parameter.

The instantaneous state of the battery can be determined, or a prediction of a future state of the storage battery can then be made, taking account of all the relevant wear factors, in that a reference to a state characteristic variable profile in a first phase of use of the storage battery, preferably the new state, is made from the functional relationship between the two state of charge values, which each relate to a different parameter, in a second phase of use of the storage battery.

These widely varying effects of the wear of storage batteries as mentioned above can now be taken into account by the method according to an exemplary embodiment simply by evaluating the functional relationship between the state of charge value $SOC_1$, which relates to a first parameter, and the state of charge value $SOC_2$, which relates to a second parameter, in a first phase and a second phase of use.

A state characteristic variable profile is preferably determined for the first phase of use as a functional relationship between the state of charge value which relates to a first parameter for the storage battery and the state of charge value which relates to a second parameter for the storage battery. The change in the state characteristic variable profile from the first phase to the second phase is then a measure of the state of the electrolyte in the storage battery, for example of the acid capacity, of the water loss, and/or of the acid stratification of the electrolyte.

Since the functional relationship is determined in the first and second phases, it is possible to deduce the wear directly from the change. According to the invention, the acid influence is in this case determined directly from the change in the state characteristic variable profile for the first phase and for the second phase.

It is also advantageous to determine the functional relationship between the state of charge values which relate to a first and a second parameter as a function of the rest voltage change after a load phase from the amount of charge transferred in the load phase. It is thus proposed that, in a first method, the state of charge be determined by measurement of the rest voltage and, in a second method, be determined by measurement of the transferred amount of charge. This is equivalent to plotting the rest voltage change before and after an electrical load phase against the net amount of charge which is transferred during the electrical load phase, and which can be measured, calculated or estimated. It should be mentioned that the amount of charge transferred is not directly equivalent to the amount of current measured during the electrical load phase. Parasitic reactions can lead to some of the current not leading to a change in the state of charge, and possibly having to be considered separately. A voltage of the unloaded storage battery is thus defined as the first parameter, and the amount of charge transferred, that is to say the charge throughput, is defined as the second parameter.

A respective characteristic variable S is expediently determined for the first phase and for the second phase from the quotient of the state of charge value change which relates to the first parameter divided by the state of charge value change which relates to the second parameter, or from the rest voltage change which relates to the amount of charge transferred during the electrical load phase. The rest voltage change is the difference between the rest voltage after the electrical load phase and the rest voltage before the electrical load phase. The characteristic variable S is thus defined as $$S = \frac{\Delta SOC_1}{\Delta SOC_2} = \frac{\Delta SOC_1(U_{00,2} - U_{00,1})}{\Delta SOC_2(\Delta Q)}$$

The state is then determined from the change in the characteristic variable S for the first phase and the second phase.

The rest voltage may be determined by measurement, estimation, or calculation with the aid of a model from the voltage behavior even in the operating state in which the battery is loaded with current.

The acid capacity $Q_0$ of the storage battery can then be determined for the first phase as a function of the characteristic variable S, for example, as a value which is inversely proportional to the characteristic variable S, provided that a corresponding voltage shift is known. The acid capacity $Q_0$ is the amount of electricity, expressed in electrical equivalents, which is stored in the sulfuric acid in the rechargeable battery.

For the method according to an exemplary embodiment, the state characteristic variable profile for the first phase can either be predetermined in a fixed manner for the battery type, may be determined by measurement, or may be learned.

In order to determine a state of charge which relates to the rest voltage, the rest voltage should be measured in the unloaded state of the storage battery after a sufficiently long rest voltage phase. However, it is also possible to calculate the rest voltage from the time profile of the battery terminal voltage during an approximately unloaded phase, or from the voltage and current profile during use of the storage battery. Determination of the rest voltage is known sufficiently well from the prior art.

An instantaneous relative state of charge value which relates to the acid capacity of the electrolyte as the first parameter can be calculated for the first phase, by way of example from the instantaneous unloaded voltage $U_0$, using the formula $$SOC'_{1,rel} = \frac{U_0}{a} - b$$

where a and b are constants which depend on the storage battery type.

However, an instantaneous absolute state of charge value which relates to the acid capacity of the electrolyte can be calculated from the relative state of charge value $SOC'_{1,rel}$ for the first phase, in particular using the formula $$SOC'_{1,abs} = SOC'_{1,rel}(Q_0) * Q_0$$

Furthermore, an instantaneous relative state of charge value $SOC''_{1,abs}$ which relates to the acid capacity of the electrolyte can be calculated for the second phase from the instantaneous unloaded voltage using the formula:

$$SOC''_{1,rel} = \frac{S'}{S''} * \left(\frac{U_0}{a} - b\right).$$

In this case, a and b are once again constants, S' is the characteristic variable for the first phase, and S'' is the characteristic variable for the second phase of the rest voltage change which relates to the amount of charge transferred during an electrical load phase.

Furthermore, an instantaneous absolute state of charge value $SOC''_{1,abs}$ (which relates to the acid capacity) for the second phase can be calculated from the relative state of charge for the second phase using the formula $$SOC''_{1,abs} = SOC''_{1,rel} * Q_0.$$

The relative or absolute state of charge values may be displayed and/or evaluated.

The ratio of the characteristic variable S' for the first phase to the characteristic variable S'' for the second phase is a measure of the wear of the storage battery. In particular, it is possible to determine the water loss (WL) from the ratio S'/S'' taking into account the previous filling level of possible acid stratification and possible further influencing variables.

It is also advantageous to determine the end of the first phase by integration of the charge throughput. The first phase ends when the integrated charge throughput exceeds a fixed minimum value. During the integration of the charge throughput, the only contributions which are preferably taken into account are those for which the changes in the state of charge values in each case exceed a fixed minimum value, so that essentially all that is considered is the operating time during which wear also occurs.

Alternatively or additionally to this, a fixed minimum time after initial use of the storage battery or a fixed minimum operating period, or a state which leads to acid stratification, may be monitored as a criterion for the end of the first phase.

The discrepancy between the instantaneous characteristic of the functional relationship in the second phase and the characteristic in the first phase for a new storage battery can, furthermore, be used to estimate the instantaneous storage capability and/or the reduction in the storage capability in comparison to the initial state in the first phase. In the case of a new storage battery, the storage capability CSC should be 100% that is to say the storage battery can be completely charged with energy. The storage capability CSC is in this case defined as the amount of charge which can be drawn from the storage battery when it has been charged to the maximum achievable state of charge (fully charged) with the rated discharge current until the final discharge voltage is reached. In the normal state, this corresponds approximately to the rated capacity and, in the case of a storage battery, decreases as a result of aging or acid stratification. The storage capability of the storage battery can be determined from one or more characteristic variables G. One example of a technical implementation is described as follows.

The storage capability of the storage battery is determined by the respective extrapolation of the functional relationship f'' to points or sections of the curve (preferably for $SOC_1$ and $SOC_2>50\%$) which relate to a state of charge value $SOC_1=0$ or $SOC_2=0$, extrapolation of the state characteristic variable profile f' to a state of charge value $SOC_1=0$ and $SOC_2=0$, and by determination of a characteristic variable G in each case from the difference between the two values:

$$G_2=f''(SOC_1=0)-f'(SOC_1=0)$$

$$G_1=f''(SOC_2=0)-f'(SOC_2=0).$$

The storage capability CSC can now be determined from the two variables by the following relationship:

$$CSC=100-MAX(G_1,G_2).$$

Owing to the MAX selection, only values greater than zero are used.

The described example represents the simplest case. According to other exemplary embodiments, it may be necessary to evaluate further characteristic variables because simple extrapolation does not lead to the desired result. Examples of this include radii of curvature, derivatives, etc. of curves for the functional relationship f'', which are not straight lines.

Furthermore, it may also be adequate to know only the amount of charge which can still be drawn in the instantaneous state of the storage battery $SOC_1$, $SOC_2$, and not the value of the storage capability CSC which relates to the fully charged storage battery. If the state of charge value $SOC_1$ is determined from the rest voltage and the state of charge value $SOC_2$ comprises the charge throughput, for example a problem of obtaining an accurate state of charge value $SOC_2$ occurs, since the value of the charge throughput becomes less accurate as a result of integration error as time passes. In this case, although it is admittedly always still worthwhile recording the state characteristic variable profile f'', the amount of charge which can be drawn can then be calculated only from the instantaneous state. This works when the functional relationship f'' has been recorded at a time comparatively close to the prediction time and the gradient of the functional relationship f'' is known. In this situation, the state of charge value $SOC''_2$ which relates to the second parameter for the second phase is determined from the functional relationship f'' with the state of charge value $SOC_1=0$ which relates to the first parameter, and the amount of charge which can still be drawn is determined from the difference $SOC_2-SOC_2''$ by multiplication by the battery capacity.

It may also be desirable to predict a voltage change $\Delta U$ when the battery is subject to a current load i. If acid stratification is present, a state of charge must for this purpose be determined as the relevant value for the calculation of the voltage level, since the two methods for state of charge determination would then give different values. The state of charge value which is then relevant for the voltage level is the state of charge value ($SOC_1$) which relates to the rest voltage.

Furthermore, it is frequently necessary to predict the voltage change and/or the voltage level of the storage battery when a specific amount of charge has been drawn from the storage battery, starting from the instantaneous state. In batteries without acid stratification, the relationship is generally known, since the relevant state of charge value simply has to be changed to match the amount of charge. In batteries with acid stratification, the characteristic of the relevant state of charge may behave differently as the amount of charge is drawn. In the case of storage batteries with acid stratification, it has been found that only a solution such as that described in the following text leads to a good prediction of the voltage level.

A voltage change to be expected when the storage battery is loaded electrically at any given temperature is determined by (1) determination of the rest voltage of the storage battery at a first time in the second phase; (2) determination of the rest voltage to be expected between the first time and a second time after a charge throughput, from the functional relationship for the second phase; (3) determination of the voltage change to be expected from the determined rest voltage to be expected, the state of charge which relates to the first parameter at the second time, and a function of the electrical internal resistance as a function of the state of charge value which is related to the first parameter; and (4) determination of a voltage to be expected as the difference between the rest voltage expected for the second time and the product of the internal resistance and an assumed current level.

In this case, use is made of the knowledge that the influence of acid stratification or aging is taken into account intrinsically during the determination of the rest voltage to be expected from the functional relationship for the, second phase, and it is possible to use this characteristic variable to deduce a functional relationship, which is essentially independent of acid stratification, between the voltage change and the rest voltage.

The voltage change to be expected can also be used to calculate a voltage to be expected as the difference between the rest voltage expected for the second time and the determined voltage change.

The voltage change to be expected can also be used to calculate a voltage to be expected as the difference between the rest voltage expected for the second time and the determined voltage change.

FIG. 1 shows a diagram of the functional relationship between the state of charge value $SOC_1$ which relates to a first parameter and the state of charge value $SOC_2$ which relates to a second parameter, at a first time (functional relationship f'), and at a later, second time (functional relationship f''). In the first phase of use of the storage battery, there is no acid stratification in the illustrated example and the acid characteristics are virtually optimum. In the second phase of use, acid stratification has started, in which the acid density in the lower area of the storage battery is higher than in the upper area of the storage battery.

The acid stratification leads to the gradient S'' of the functional relationship f'' in the second phase increasing, owing to the acid influence, in comparison to the gradient S' of the functional relationship f' in the first phase.

In the illustrated example, the rest voltage $U_{00}$ was determined as the first parameter, and the amount of charge $\Delta Q$ transferred during a load phase was determined as the second parameter. This corresponds to a graph in which the rest voltage change $\Delta U_{00}$ is plotted against the amount of charge $\Delta Q$ transferred in the associated electrical load phase.

According to the invention, a state characteristic variable profile f' is defined or determined in a first phase of use and may, for example, be the functional relationship f', as illustrated in FIG. 1, between the first state of charge values $SOC_1$, which are determined from the rest voltage $U_{00}$, and the state of charge values $SOC_2$ determined from the amounts of charge Q transferred.

However, by way of example, for heavy-current prediction, it is also possible to determine the profile of the minimum voltage $U_{min}$ as a function of the state of charge $SOC_1$ which relates to the rest voltage.

An instantaneous state value can then be determined from the functional relationship f" for the second phase, by reference to the state characteristic variable profile f' for the previous, first phase, or a future state can be predicted. The state then intrinsically includes all the relevant wear influences, in particular the acid influence.

The state of charge, the overall storage capability, the internal resistance, the heavy-current capability, the load capability, the charging efficiency, the heating, the temperature and the temperature distribution within the storage battery, etc. may be determined as state characteristic variables, and the described method can be linked to other state determination methods. A phase change of components of the storage battery, for example solidification of the electrolyte, can also be determined if required with the assistance of further known methods using the method according to the invention, since the solidification temperature is changed by the water loss WL and acid stratification.

By way of example, the wear, for example from loss of water WL and/or acid stratification, can be determined from the change in the relationship between the rest voltage $U_{00}$ and the state of charge, as follows. Characteristic variables S' for a first phase and S" for a second phase of use of the storage battery are in each case determined by determination of the rest voltage $U_{00,1}$ before an electrical load phase; determination of the rest voltage $U_{00,2}$ after an electrical load phase; and determination of the amount of charge $\Delta Q$ transferred during this load phase.

The characteristic variable S is then determined using the formula $$S = \frac{\Delta SOC_1}{\Delta SOC_2} = \frac{\Delta SOC_1(U_{00,2} - U_{00,1})}{\Delta SOC_2(\Delta Q)}$$

and corresponds to the quotient of the change in the state of charge value $\Delta SOC_1$ which relates to the first parameter $U_{00}$ divided by the change in the state of charge value $\Delta SOC_2$ which relates to the second parameter Q. For the first phase of use of the storage battery, preferably in the new state, this results in a different value for the characteristic variable S' than in a subsequent, second phase, in which, for example, a loss of water WL or acid stratification has occurred.

Figure 2:
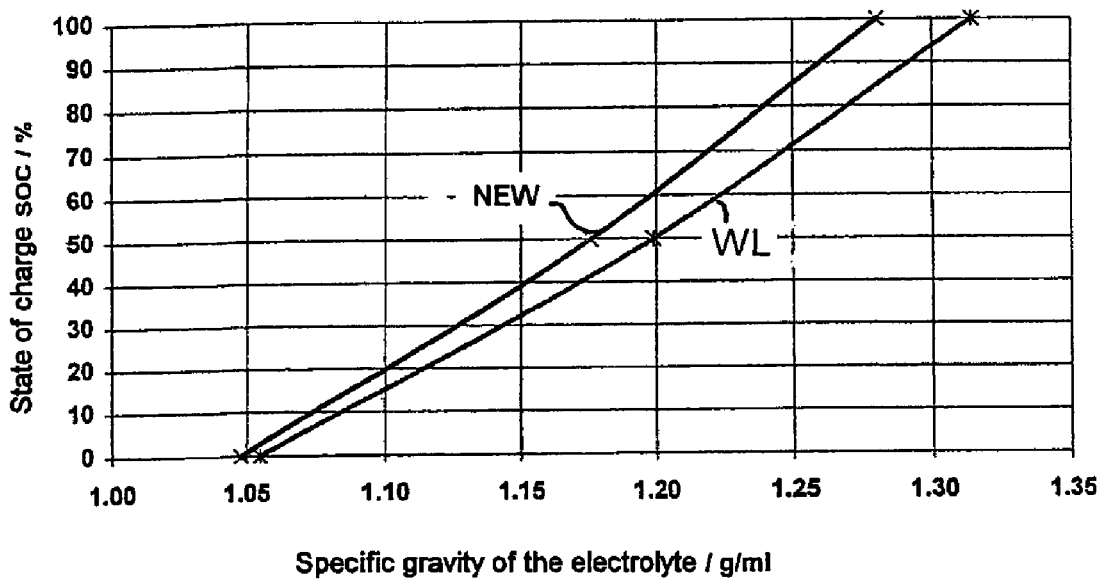
FIG. 2 shows a graph of a functional relationship between the state of charge value of a storage battery and the specific gravity of the electrolyte in a new state and after a loss of water.

This can be seen from FIGS. 1 and 2. In FIG. 2, the state of charge $SOC_1$ which relates to the rest voltage is plotted against the specific gravity of the electrolyte for the first phase in the new state, and for the second phase after wear V, using the example of a lead-acid rechargeable battery with six cells connected in series.

The characteristic variable S', which is characteristic of the first phase, is either determined by measurement, estimation, or calculation, or is predetermined in a fixed manner for the storage battery type. After completion of the first phase, the characteristic variable S' is no longer changed.

The characteristic variable S" is updated in the second phase, and includes information about the wear in its progressive change. The relative change (S"–S')/S' or the ratio S"/S' or the like may be chosen, by way of example, as the measure for the wear.

The relationship between the measured or the estimated rest voltage $U_{00}$ and the state of charge value SOC also changes with the change in the characteristic variable S as a consequence of the wear. FIG. 2 shows that a certain change in the electrolyte acid density or in the rest voltage $U_{00}$ in the second phase is associated with a reduced charge transfer, that is to say, a reduced change in the state of charge, than in the first phase. However, if, by way of example, the wear is known from the method mentioned above, then this change can be taken into account for a corrected state of charge statement.

It is thus possible, for example, to determine the actual state of charge SOC" in the second phase from the state of charge value $SOC_1$, which would be obtained from a specific rest voltage $U_{00}$, for this rest voltage $U_{00}$ using the formula $$SOC'' = \left(\frac{S'}{S''}\right) \cdot SOC_1$$

The decision as to whether the storage battery is still in the first phase of use or has already entered the second phase may be made, for example, on the basis of a fixed minimum duration after installation of the storage battery, or after a minimum operating period. However, it can also be integrated from the time when the charge throughput first commenced, and the first phase can be ended as soon as the integral charge throughput exceeds a minimum value. In this case, the only contributions to the charge throughput which are taken into account are preferably those in which the changes to the state of charge values each exceed a minimum value.

In some circumstances, it is expedient for evaluation to calculate an up-to-date relative state of charge value $SOC_{1,rel}(K_{nom})$, which relates to the rated capacity $K_{nom}$ from the relative state of charge value $(SOC_{1,rel}(Q_0)$ which relates to the acid capacity $Q_0$, for example, using the formula $$SOC_{1,rel}(K_{nom}) = \frac{(a + (b-a) \cdot (SOC_{1,rel}(Q_0)) - f_0)}{(f_1 - f_0)}$$

In this case, a and b are fixed state of charge values and a is less than b. The variable $f_0$ is the state of charge value $SOC_{1,rel}(Q_0)$ which corresponds to the relative state of charge value $SOC_{1,rel}(K_{nom})$=a and relates to the acid capacity $Q_0$, and $f_1$ is the state of charge value $SOC_{1,rel}(Q_0)$ which corresponds to the relative state of charge $SOC_{1,rel}(K_{nom})$=b and relates to the acid capacity $Q_0$.

An up-to-date absolute state of charge value $SOC_{1,abs}(K_{nom})$ which relates to the rated capacity $K_{nom}$ can be calculated from the relative state of charge value $SOC_{1,rel}(K_{nom})$ and can be evaluated using the formula $$SOC_{1,abs}(K_{nom}) = SOC_{1,rel}(K_{nom}) \cdot K_{nom}$$

By way of example, the above-described corrected state of charge value SOC", a relative state of charge value $SOC_{1,rel}$ which relates to the acid capacity $Q_0$, an absolute state of charge value $SOC_{1,abs}$ which relates to the acid capacity $Q_0$, a relative state of charge $SOC_{1,rel}(K_{nom})$ which relates to the rated capacity $K_{nom}$ or an absolute state of charge $SOC_{1,abs}(K_{nom})$ which relates to the rated capacity $K_{nom}$ can thus be calculated and evaluated as a state characteristic variable.

FIG. 3 shows a sketch with the influence of aging and acid stratification on the profile of the functional relationship between the rest voltage $U_{00}$ and the amount of charge $\Delta Q$ transferred. The storage battery is sketched as a reservoir which can be filled with charge (which is sketched in black) but from which charge can flow via the outlet which is sketched on the right at the bottom. FIG. 3a shows the state of the storage battery when new, in which the storage capability CSC has not been reduced and is 100%. The reservoir can thus be filled completely. When new, the functional relationship between the rest voltage $U_{00}$ and the amount of charge $\Delta Q$ transferred is a straight line which has a defined gradient that is dependent on the respective storage battery type.

FIG. 3b shows an aged storage battery whose storage capability CSC" has been reduced by the aging influence. The reduction $Q_v$ in the storage capability does not, however, affect the charging and discharge phases, but leads only to the rechargeable battery being exhausted earlier. In principle, the functional relationship between the rest voltage $U_{00}$ and the amount of charge $\Delta Q$ transferred thus remains unchanged, but the straight line ends in the lower area at the value of the charge reduction $Q_v$ on the abscissa of the charge transfer $\Delta Q$.

FIG. 3c shows the influence of acid stratification on a storage battery. This has an effect over the entire area of the reservoir both in the low state of charge range and in the high state of charge range, and leads to the functional relationship between the rest voltage $U_{00}$ and the amount of charge $\Delta Q$ transferred having a steeper curve profile.

FIG. 3d shows both the influence of the aging influence and of acid stratification on the storage capability CSC and on the functional relationship between the rest voltage $U_{00}$ and the amount of charge $\Delta Q$ transferred. This clearly shows that the storage capability CSC is reduced by the charge reduction $Q_v$ in the lower area, and is reduced over the entire spatial content by the influence of acid stratification. With respect to the functional relationship, this leads to a curve profile which is terminated at the point of the charge reduction $Q_v$ on the abscissa which is steeper than when the storage battery is in the new state.

The storage capability CSC is the amount of charge which can be drawn from the storage battery once it has been charged to the maximum achievable state of charge (fully charged) with the rated discharge current until the final discharge voltage is reached. In the normal state, this corresponds approximately to the rated capacity. When the battery is old, and when acid stratification occurs as well, it is reduced, as is sketched in FIGS. 3c and 3d. If the storage capability CSC is known, it is also possible to deduce the amount of charge Q which can still be drawn from this state with the rated current, if the state of charge SOC is known.

The change (which is sketched in FIGS. 1 and 3) to the functional relationship between the first state of charge $SOC_1$, which relates to the rest voltage $U_{00}$, and the second state of charge $SOC_2$, which relates to the charge transfer $\Delta Q$, can be used to determine the unloaded terminal voltage $U''_{00,2}$ at a different time $t_2$ in the second phase, when a charge transfer $\Delta Q$ has taken place in the meantime. This unloaded terminal voltage $U''_{00,2}$ calculated in this way is used as a parameter value in order to calculate a sudden voltage change $\Delta U$ when an electrical load i is applied at a temperature T, with the relationship that is used in this case to a previous time being determined or even predetermined in a fixed manner. The unloaded terminal voltage $U''_{00,2}$ is also used as the starting point for calculation of a voltage U on load using the formula $U=U_{00}-\Delta U$. This so-called heavy-current prediction is sketched in FIG. 4.

First of all (step a), the unloaded rest voltages $U''_{00,1}$ are determined at a number of times $t_1$ for different depths of discharge DoD and state of charge values $SOC_i$ which relate to the first parameter, in order to record a functional relationship f" for the second phase.

The rest voltage $U_{00}$ is in this case the voltage of the storage battery in a specific state, which is characterized by the temperature T and the state of charge SOC and which is produced a certain time after the end of electrical loading. In general, in addition to the major reactions of charging and discharging at the two electrodes, internal charge transfers and parasitic reactions also take place in a storage battery, for example spontaneous gas development, and these influence the cell voltage. These effects are particularly major when charging precedes the phase after the end of electrical loading in which the rest voltage $U_{00}$ is intended to be determined. Importance must therefore be placed on the use of reproducible conditions for the determination of the rest voltage $U_{00}$. The rest voltage $U_{00}$ is preferably determined in a storage battery state prior to which at least about 3-5% of the storage capability CSC has been discharged. This results in a very stable reproducible rest voltage $U_{00}$ after about 1 to 4 hours at room temperature. In other situations, for example when major charging has taken place prior to this it is possible instead of this to add an additional amount of charge of, for example, 5% of the storage capability CSC using a 20-hour current $I_{20}$, followed by a further discharge again. The voltage U which is then produced after a further 1 to 4 hours at room temperature is very close to the rest voltage $U_{00}$.

In this case, the current I flowing into the storage battery during charging and flowing out of the storage battery during discharge is measured during a load phase (step b), and the amount of charge $\Delta Q(t)$ transferred during the load phase is determined by integration (step c).

A functional relationship between the rest voltage $U_{00}$ and the charge transfer $\Delta Q$ is determined from the rest voltages $U_{00}$ and from the determined charge transfer $\Delta Q(t)$ for the second phase of use of the storage battery, in which case methods for interpolation, extrapolation and linearization can also be used (step d).

A rest voltage $U''_{00,2}$ for the instantaneous time $t_1$ is determined in a step e) in order to predict a rest voltage $U''_{00,2}$ at a subsequent, second time $t_2$ in the second phase after a specific charge transfer $\Delta Q$.

The expected charge transfer $\Delta Q$ from the instantaneous time $t_1$ to the future, second time $t_2$ is determined in a step f). The rest voltage $U''_{00,2}$ to be expected at the subsequent, second time $t_2$ is predicted from these values, with the assistance of the functional relationship determined in step d) (step g).

In order to predict a voltage $U_2$ on load at the second time $t_2$ from the rest voltage $U_{00,2}$ predicted in this way for a temperature $T_2$ at the second time $t_2$ and for a load current $I_2$, the voltage drop function (which is characteristic of the storage battery) is determined or defined from the rest voltage $U_{00}$, from the load current I and from the temperature T in a step h), or a function such as this is accessed.

The temperature $T_2$ to be expected at the second time $t_2$ is determined, defined or predicted in a step i).

The voltage drop $\Delta U$ at the second time $t_2$ when loaded with the current $I_2$ is then predicted in a step k) from the functional relationship with step h) and the rest voltage $U_{00,2}$ and the temperature $T_2$ are predicted by reading the associated value from the family of characteristics.

The voltage to be expected on load $U_2$ is then predicted in a step l) from the rest voltage $U_{00,2}$ and from the voltage drop U$\Delta$U as the difference:

$$U_2 = U_{00,2} - \Delta U$$

Figure 5:
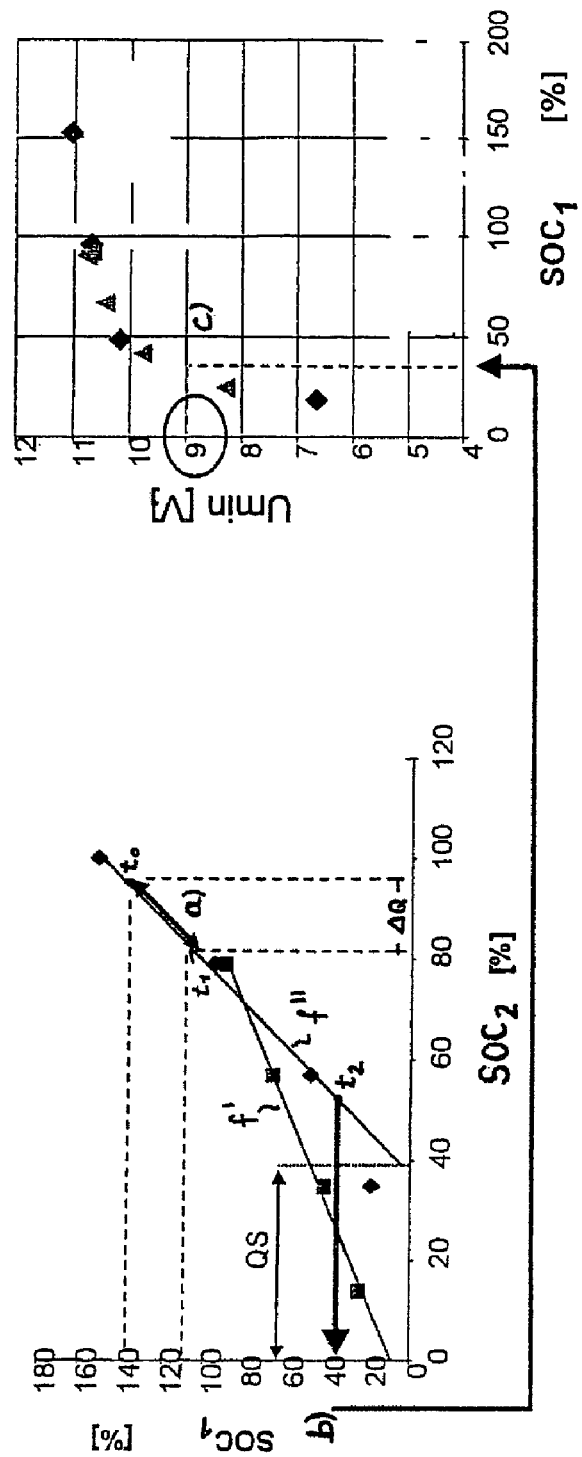
FIG. 5 shows a graph of the functional relationship in a first and a second phase, and of the profile of the minimum voltage as a function of the state of charge value which relates to the rest voltage, with the method steps for heavy-current prediction.

FIG. 5 shows the method procedure for heavy-current prediction on the basis of the functional relationship between the state of charge value $SOC_1$ which relates to the rest voltage $U_{00}$ and the state of charge value $SOC_2$ which relates to the charge transfer $\Delta Q$. This makes use of the fact that the minimum voltage $U_{min}$ matches the curve response well, with or without acid stratification, as a function of the first state of charge value $SOC_1$ which relates to the rest voltage $U_{00}$. The prediction of the minimum voltage $U_{min}$ is thus based on the state of charge value SOC which relates to the rest voltage $U_{00}$.

In the second phase, in which, in some circumstances, acid stratification occurs, the rest voltage $U_{00}$ before and after a load phase, and the amount of charge $\Delta Q$ transferred during the load phase are determined in a first step a), and this is used to determine the curve profile f'', which is illustrated for the second phase with acid stratification, as straight lines which are tilted and offset with respect to the first phase (f') without acid stratification.

The state of charge value $SOC_1$'' which is to be expected for a specific state of charge SOC and relates to the rest voltage $U_{00}$ is determined from the curve profile f'' for a second time $t_2$ in the second phase. In the example illustrated in FIG. 5, this is 40% for a degree of discharge of about 55%.

The minimum voltage $U_{min}$=9V to be expected for the previously determined state of charge value $SOC_1$''=40% is now read in a step c) from the known functional relationship between the minimum voltage $U_{min}$ and the state of charge value $SOC_1$'' which relates to the rest voltage $U_{00}$. This minimum voltage $U_{min}$ may be output or, for example, may be used to assess whether the state of charge value SOC at the second time $t_2$ is still sufficient, for example, to start a motor vehicle.

The functional relationship between the minimum voltage $U_{min}$ and the state of charge value $SOC_1$'' which relates to the rest voltage $U_{00}$ may also be a family of characteristics which is dependent on the temperature T and a discharge current I.

Figure 6:
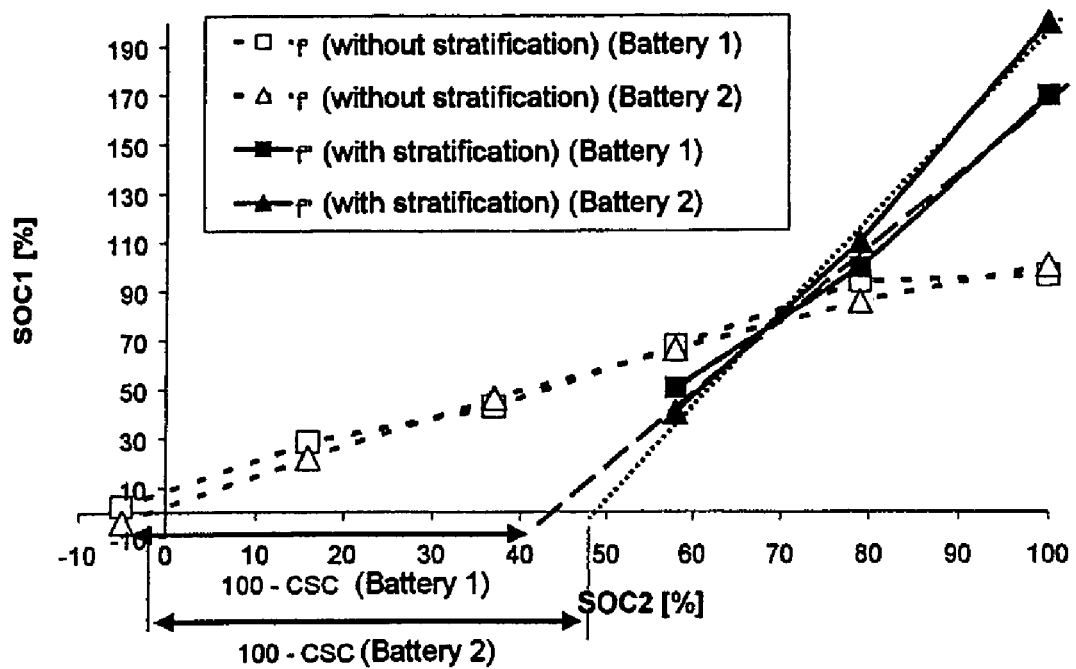
FIG. 6 shows the functional relationship between the state of charge which relates to a first parameter and the state of charge which relates to a second parameter, and determination of the storage capability.

The storage capability of the storage battery can be determined from one or more characteristic variables G. This will be explained in the following text with reference to an example of a technical implementation with the aid of FIGS. 6 and 7. FIG. 6 shows a graph of the functional relationship between the state of charge value $SOC_2$ which relates to a first parameter and the state of charge value $SOC_2$ which relates to a second parameter, with further straight lines for determination of the storage capability CSC.

For this purpose, the storage capability CSC of the storage battery is determined by respective extrapolation of the functional relationship f'' to a state of charge value $SOC_1$=0 or $SOC_2$=0 at specific points or in specific sections of the curve, in particular for state of charge values $SOC_2$ and/or $SOC_2$ of greater than 50%. Furthermore, the state characteristic variable profile f' is extrapolated to a state of charge value $SOC_1$=0 and $SOC_2$=0. The characteristic variable $G_1$, $G_2$, which is characteristic of the first parameter and of the second parameter, respectively, is then in each case determined from the difference between the extrapolated values, as follows:

$$G_2 = f''(SOC_1=0) - f'(SOC_1=0)$$

$$G_1 = f''(SOC_2=0) - f'(SOC_2=0).$$

The storage capability can now be determined from these two variables by means of the following relationship:

$$CSC = 100\% - MAX(G_1, G_2).$$

In the illustrated example, the state characteristic variable profile f' is extrapolated to the value $SOC_1$=0. Furthermore, the functional relationship f'', which was assumed in the second phase with acid stratification, is likewise extrapolated to the state of charge value $SOC_1$=0. The state characteristic variable profile f' was, in contrast to the functional relationship f'', recorded in a previous, first phase, in which no aging or acid stratification had yet occurred.

The state characteristic variable profile resulting from the extrapolation process passes virtually through the origin, and this results in the characteristic variable $G_2$=40%. The storage capability is thus CSC 100%−40%=60%. The value from the state characteristic variable f' would result in approximately zero for the characteristic variable $G_1$, which relates to the second parameter, where $SOC_2$=0. The value which results from the functional relationship f'' for the second phase would be negative for an assumed state of charge value of $SOC_2$=0.

The characteristic variable $G_2$ which relates to the first state of charge value $SOC_1$ is thus used for determination of the storage capability CSC.

Figure 7:
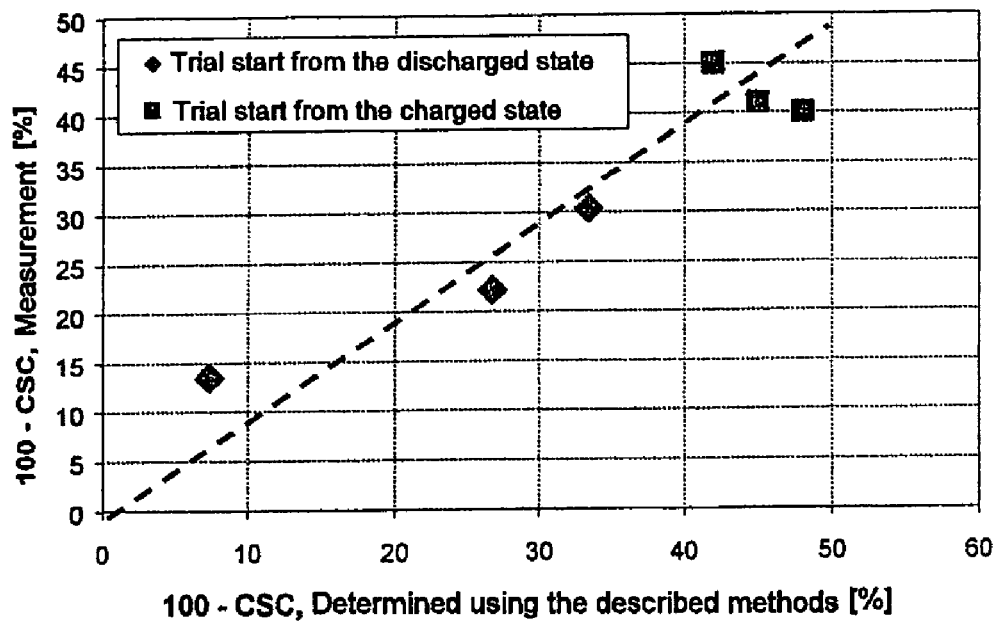
FIG. 7 shows a graph of the quality of the determination of the storage capability using the method according to an exemplary embodiment.

FIG. 7 shows the quality of the determination of the storage capability CSC using the method as described above. This clearly shows that the discrepancies between the measured storage capability and the storage capability CSC determined using the method according to the invention are within an acceptable tolerance for trials with a different procedure (shown as diamonds in FIG. 7) or starting from a charged state (starting from a discharged state (shown as squares in FIG. 7)).

Figure 8:
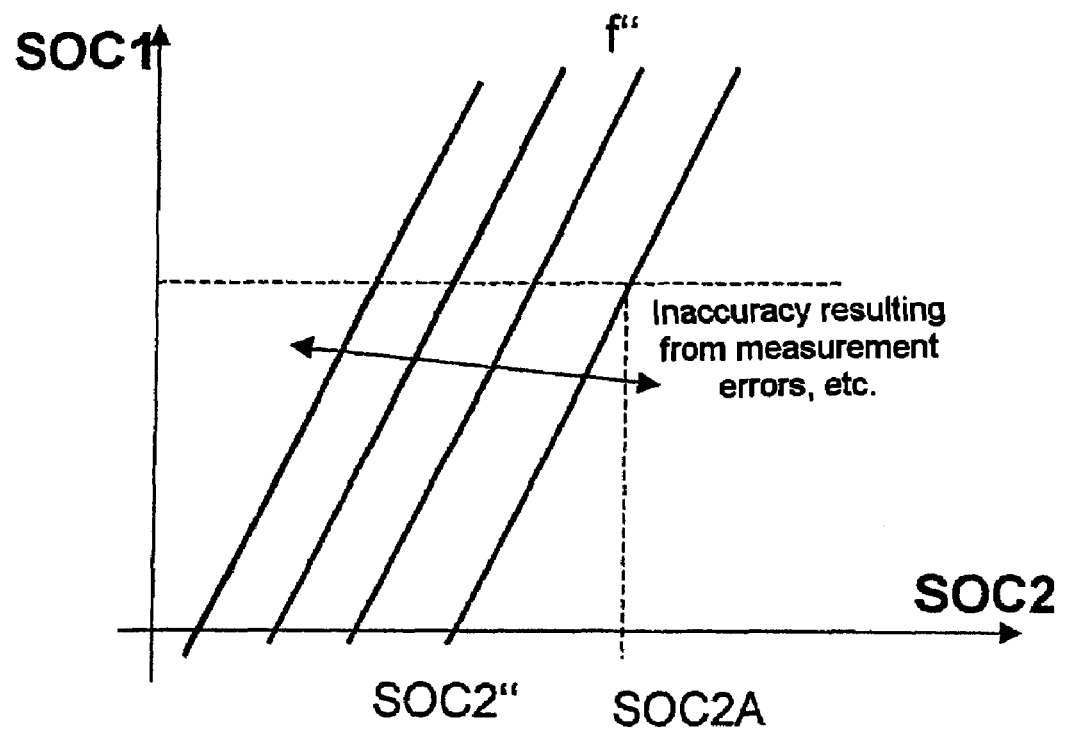
FIG. 8 shows a graph of the functional relationship between the state of charge value which relates to a first parameter and the state of charge value which relates to a second parameter, illustrating the method for determination of the amount of charge which can be drawn in the instantaneous state.

FIG. 8 shows a graph of the functional relationship between the state of charge value $SOC_1$ which relates to a first parameter and the state of charge value $SOC_2$ which relates to a second parameter for a second phase of use of the storage battery, for determination of the instantaneously available amount of charge and in which case, by way of example, acid stratification has occurred.

In some circumstances, it may be sufficient to determine only the amount of charge which can still be drawn in the instantaneous state of the storage battery ($SOC_1$, $SOC_2$), and not the storage capability value CSC which relates to the fully charged storage battery. If the state of charge value $SOC_1$ which relates to the first parameter is determined from the rest voltage $U_{00}$, and the state of charge value $SOC_2$ which relates to the second parameter is determined from the charge throughput Q, there is a problem, for example, in obtaining an accurate value for the state of charge value $SOC_2$ which relates to the second parameter, since the value for the charge throughput becomes more inaccurate as a result of integration errors as time passes. In this situation, it is then admittedly always worthwhile recording the functional relationship f''. However, the amount of charge which can be drawn should then be calculated starting from the instantaneous state. This is possible when the functional relationship f'' was recorded comparatively close to the prediction time and the gradient of the functional relationship f''is known. In this situation, the state of charge value $SOC_2$'' which relates to the second parameter is determined from the functional relationship f'' for $SOC_1$=0. The amount of charge which can still be drawn is determined from the difference between the instantaneous state of charge value $SOC_{2A}$, which relates to the second parameter, and the determined state of charge value $SOC_2$'' and by multiplication of the difference by the battery capacity.

This therefore also makes it possible to compensate for inaccuracies caused, for example, by measurement errors.

It is important to note that the methods described with respect to the exemplary embodiments are illustrative only. Although only a few embodiments of the present inventions have been described in detail in this disclosure, those skilled in the art who review this disclosure will readily appreciate that many modifications are possible without materially departing from the novel teachings and advantages of the subject matter recited in the claims. Accordingly, all such modifications are intended to be included within the scope of the present invention as defined in the appended claims. The order or sequence of any process or method steps may be varied or re-sequenced according to alternative embodiments. Other substitutions, modifications, changes and omissions may be made in the design, operating conditions and arrangement of the preferred and other exemplary embodiments without departing from the scope of the present invention as expressed in the appended claims.

What is claimed is:

1. A method for prediction of electrical characteristics of an electrochemical storage battery, the method comprising:
   determining a functional relationship between a first set of state of charge values which are related to a first parameter for a storage battery and a second set of state of charge values which are related to a second parameter for the storage battery for a second phase of use of the storage battery;
   determining at least one characteristic variable using the functional relationship for the second phase and a functional relationship for a previous first phase of use of the storage battery; and
   predicting electrical characteristics of the storage battery utilizing a the characteristic variable.

2. The method of claim 1 further comprising determining the functional relationship for the first phase of use by determining the functional relationship between the state of charge values which are related to the first parameter for the storage battery and the state of charge values which are related to the second parameter for the storage battery, wherein the change in the functional relationships from the first phase to the second phase is a measure of the state of electrolyte in the storage battery.

3. The method of claim 2 further comprising determining at least one of an acid capacity, a water loss, and an acid stratification of the electrolyte as a function of the change in the state characteristic variable profile from the first phase to the second phase.

4. The method of claim 1 wherein the first parameter is a voltage of the storage battery.

5. The method of claim 4 wherein the second parameter is a charge throughput of the storage battery.

6. The method of claim 5 further comprising determining the second state of charge value by balancing the current which has flowed between a first operating time and a second operating time as the transferred amount of charge.

7. The method of claim 6 further comprising determining a respective characteristic variable for the first phase and for the second phase from the ratio of the change in the state of charge value which relates to the first parameter to the change in the state of charge value which relates to the second parameter, or of the rest voltage change which relates to the amount of charge transferred during the electrical load phase, as the difference between the rest voltage after the electrical load phase and the rest voltage before the electrical load phase, using the formula $$S' = \frac{\Delta SOC_1'}{\Delta SOC_2'} = \frac{U_{00,2}' - U_{00,1}'}{\Delta Q'} \text{ and } S'' = \frac{\Delta SOC_1''}{\Delta SOC_2''} = \frac{U_{00,2}'' - U_{00,1}''}{\Delta Q''}$$

where S' is the characteristic variable for the first phase and S" is the characteristic variable for the second phase, and determining the state from the change in the characteristic variable from the first phase to the second phase state, where the state is approximately equal to the value of S"/S'.

8. The method of claim 7 further comprising determining the acid capacity of the storage battery for the first phase as a function of the characteristic variable state, with the acid capacity being inversely proportional to the characteristic variable state.

9. The method of claim 8 further comprising measuring a rest voltage in an unloaded state for the storage battery after a rest voltage phase.

10. The method of claim 9 further comprising calculating the rest voltage from a time profile of battery terminal voltage during an approximately unloaded phase.

11. The method of claim 9 further comprising calculating the rest voltage from a voltage and current profile during use of the storage battery.

12. The method of claim 1 further comprising calculating an instantaneous relative state of charge value which relates to an acid capacity of electrolyte for the first phase from an instantaneous unloaded voltage using the formula $$SOC_{1,rel}' = \left(\frac{U_0}{a}\right) - b$$

where a and b are constants and $U_0$ is the instantaneous unloaded voltage.

13. The method of claim 12 further comprising calculating an instantaneous absolute state of charge, which relates to the acid capacity of the electrolyte, for the first phase using the formula $$SOC_{1,abs}' = SOC_{1,rel}' Q_0$$

where $Q_0$ is the acid capacity of the electrolyte.

14. The method of claim 13 further comprising calculating an instantaneous relative state of charge value, which relates to the acid capacity of the electrolyte, for the second phase from the instantaneous unloaded voltage using the formula $$SOC_{1,rel}'' = \frac{S'}{S''} \cdot \left(\frac{U_0}{a} - b\right),$$

where a and b are constants, S' is the characteristic variable for the first phase, and S" is the characteristic variable for the second phase of the rest voltage change which relates to the amount of charge transferred during an electrical load phase.

15. The method of claim 14 further comprising calculating an instantaneous absolute state of charge value, which relates to the acid capacity for the second phase, using the formula $$SOC_{1,abs}'' = SOC_{1,rel}'' \cdot Q_0.$$

16. The method of claim 15 further comprising determining a measure for wear of the storage battery in the second phase from the characteristic variables S' for the first phase and S" for the second phase based on the ratio S"/S' or as the relative change (S"−S')/S'.

17. The method of claim 15 further comprising determining the end of the first phase by integration of the amount of charge throughput for the storage battery, with the first phase being ended when the integrated charge throughput exceeds a fixed minimum value.

18. The method of claim 17 wherein the only contributions which are taken into account for the integration of the charge throughput are those for which the changes in the state of charge value exceed a fixed minimum value.

19. The method of claim 15 further comprising determining the end of the first phase as a function of one of a fixed minimum time after initial use of the storage battery and a fixed minimum operating period.

20. The method of claim 15 further comprising determining the end of the first phase when acid stratification has been identified.

21. The method of claim 15 further comprising determining the storage capability of the storage battery by means of a functional relationship between the characteristic variable and the storage capability.

22. The method of claim 21 wherein the storage capability is determined by the following steps:
extrapolating of the state characteristic variable profile for the first phase and the functional relationship for the second phase at defined points or in defined sections to a zero value of the state of charge value which relates to the first parameter;
determining the state of charge values which relate to the second parameter for the first phase and for the second phase with the aid of the state characteristic variable profile for the first phase, and of the functional relationship for the second phase for a state of charge value which relates to the first parameter and is equal to zero;
determining a characteristic variable which relates to the second parameter from the difference between the state of charge value which relates to the second parameter for the first phase and the state of charge value which relates to the second parameter for the second phase;
determining a state of charge value which relates to the first parameter for the first phase and a state of charge value which relates to the first parameter for the second phase from the state characteristic variable profile and from the functional relationship with a state of charge value which relates to the second parameter and is equal to zero;
determining a characteristic variable which relates to the first parameter from the difference between the state of charge value which relates to the first parameter for the first phase, and the state of charge value which relates to the first parameter for the second phase;
determining the storage capability of the storage battery from the functional relationship between the characteristic variable which relates to the first parameter, the characteristic variable which relates to the second parameter, and the storage capability.

23. The method of claim 22 wherein the storage capability is calculated using the formula CSC=100−MAX ($G_1$, $G_2$), where CSC is the storage capability of the storage battery, $G_1$ is the characteristic variable which relates to the first parameter, and $G_2$ is the characteristic variable which relates to the second parameter.

24. The method of claim 22 wherein the extrapolating step is carried out in areas of charge values greater than 50%.

25. A method for prediction of electrical characteristics of an electrochemical storage battery, the method comprising:
determining a functional relationship between a first state of charge value which is related to a first parameter for a storage battery and a second state of charge value which is related to a second parameter for the storage battery for a second phase of use of the storage battery;
determining at least one characteristic variable using the functional relationship for the second phase and a functional relationship for a previous first phase of use of the storage battery;
predicting electrical characteristics of the storage battery utilizing the characteristic variable; and
determining an amount of charge which can be drawn in an instantaneous state from the difference between a state of charge value and the characteristic variable as the value of the state of charge value which is related to the second parameter from the functional relationship with the state of charge value which is related to the first parameter and is equal to zero, and with the difference multiplied by the battery capacity representing the amount of charge which can still be drawn in the instantaneous state.

26. The method of claim 1 further comprising using a state of charge value to determine a voltage change to be expected when an electrical load is applied to the storage battery at a temperature, as a function of the relationship, which is dependent on the characteristic variable for the state of charge, between the voltage change and the electrical load.

27. The method of claim 1 further comprising:
determining a rest voltage of the storage battery at a first time in the second phase as a measure of the state of charge value;
determining a rest voltage to be expected between the first time and a second time after a charge throughput, from the functional relationship for the second phase;
determining a state of charge value for the second time;
determining the voltage change to be expected from the determined rest voltage to be expected, the state of charge value and a function of the electrical internal resistance as a function of the state of charge value which is related to the first parameter; and
determining a voltage to be expected as the difference between the rest voltage expected for the second time and the product of the internal resistance and an assumed current value.

28. The method of claim 1 further comprising:
determining a rest voltage of the storage battery at a first time in the second phase as the state of charge value;
determining a rest voltage to be expected between the first time and a second time after a charge throughput, from the functional relationship for the second phase;
determining the voltage change to be expected from the determined rest voltage to be expected, the state of charge value and a function of the voltage difference, as a function of the state of charge value which is related to the first parameter; and
determining a voltage to be expected as the difference between the rest voltage expected at the second time and the determined voltage change.

* * * * *

UNITED STATES PATENT AND TRADEMARK OFFICE
CERTIFICATE OF CORRECTION

| | | |
|---|---|---|
| PATENT NO. | : 7,253,587 B2 | Page 1 of 1 |
| APPLICATION NO. | : 10/912748 | |
| DATED | : August 7, 2007 | |
| INVENTOR(S) | : Eberhard Meissner | |

It is certified that error appears in the above-identified patent and that said Letters Patent is hereby corrected as shown below:

Column 15;

Line 34; "a" should be removed from between "utilizing" and "the"

Signed and Sealed this

Eighteenth Day of December, 2007

JON W. DUDAS
*Director of the United States Patent and Trademark Office*